US011871667B2

(12) United States Patent
Thirunavukarasu et al.

(10) Patent No.: US 11,871,667 B2
(45) Date of Patent: Jan. 9, 2024

(54) METHODS AND APPARATUS FOR WARPAGE CORRECTION

(71) Applicant: APPLIED MATERIALS, INC., Santa Clara, CA (US)

(72) Inventors: Sriskantharajah Thirunavukarasu, Singapore (SG); Puay Han Tan, Singapore (SG); Karrthik Parathithasan, Singapore (SG); Jun-Liang Su, Singapore (SG); Fang Jie Lim, Singapore (SG); Chin Wei Tan, Singapore (SG); Wei Jie Dickson Teo, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 646 days.

(21) Appl. No.: 17/023,999

(22) Filed: Sep. 17, 2020

(65) Prior Publication Data

US 2022/0085268 A1 Mar. 17, 2022

(51) Int. Cl.
*H10N 10/17* (2023.01)
*H01L 23/00* (2006.01)
*H05K 1/02* (2006.01)

(52) U.S. Cl.
CPC .......... *H10N 10/17* (2023.02); *H01L 23/562* (2013.01); *H05K 1/0271* (2013.01)

(58) Field of Classification Search
CPC . H10N 10/17; H01L 23/562; H01L 21/67248; H01L 21/67109; H05K 1/0271
See application file for complete search history.

(56) References Cited

U.S. PATENT DOCUMENTS

| 6,271,459 | B1 | 8/2001 | Yoo |
| 6,410,971 | B1 | 6/2002 | Otey |
| 2006/0254716 | A1 | 11/2006 | Mosden et al. |
| 2008/0217293 | A1* | 9/2008 | Iimuro ............. H01L 21/67196 |
| | | | 216/57 |

(Continued)

FOREIGN PATENT DOCUMENTS

JP 2008013200 A 1/2006

OTHER PUBLICATIONS

International Search Report for PCT/US2021/048342, dated Dec. 23, 2021.

*Primary Examiner* — John P. Dulka
(74) *Attorney, Agent, or Firm* — MOSER TABOADA

(57) ABSTRACT

Methods and apparatus for processing a substrate are provided herein. For example, a system for processing a substrate includes a process chamber comprising a first processing volume and a second processing volume, a carrier disposed in the first processing volume, comprising a first thermoelectric module (TEM), and configured to support the substrate while the substrate is being heated or cooled, a chuck disposed within the second processing volume, comprising a second TEM, and configured to receive the substrate from the carrier and to support the substrate while the substrate is being heated or cooled, and a system controller configured to monitor a temperature of at least one of the substrate, the carrier, or the chuck during operation, and based on the temperature of the at least one of the substrate, the carrier, or the chuck, supply current to at least one of the first TEM or the second TEM.

17 Claims, 3 Drawing Sheets

(56) References Cited

U.S. PATENT DOCUMENTS

| | | | |
|---|---|---|---|
| 2008/0230180 A1* | 9/2008 | Yoneda | H01L 21/324 |
| | | | 118/728 |
| 2009/0084423 A1 | 4/2009 | Horio | |
| 2010/0031989 A1 | 2/2010 | Kinoshi et al. | |
| 2012/0304483 A1 | 12/2012 | Sirard et al. | |
| 2017/0110298 A1 | 4/2017 | Ricci et al. | |

* cited by examiner

METHODS AND APPARATUS FOR WARPAGE CORRECTION

FIELD

Embodiments of the present disclosure generally relate to methods and apparatus for processing a substrate, and more particularly, to methods and apparatus configured to control a temperature of substrate during processing, e.g., for warpage correction.

BACKGROUND

With the rapid growth in technology, there has been an increasing trend in microchips getting smaller but being packed with more and more transistors in a dense integrated circuit, e.g., due to the demand for smaller footprints. The manufacturing line can include one or more front-end-of-line (FEOL) and back-end-of-line (BEOL) processes, such as physical vapor deposition (PVD), chemical vapor deposition (CVD), lithography, curing, molding, (e.g., for both fan-out wafer-level packaging (FOWLP) and integrated fan out (InFO), warpage correction, etc. Such processes, typically, occur at relatively high temperatures to facilitate chemical reactions to enable, for example, an alteration of the substrate structures, film growth, and removal of materials, thus providing more robust substrates.

Accordingly, during such high temperature processes, thermal management of the substrate is imperative to avoid defects that may occur at a micro level, thus impacting the overall yield. For example, as plasma processing temperatures can be greater than 200° C., thermal management of the substrate can play a key factor in achieving an acceptable, contact resistance (Rc). Moreover, thermal management of the substrate can be vital in the prevention of substrate warpages, which can cause increased stress levels, e.g., due to coefficient of thermal expansion (CTE) mismatch, and defect generation of dielectric films, which can cause a degradation in device performance. Furthermore, an inability to control the temperature gradient across a substrate can cause plastic deformation of the substrate, as stress levels can surpass a critical limit, which, in turn, can cause pattern misregistration pattern misalignment, and ultimately device failure.

Conventional methods/apparatus configured for thermal management of a substrate during one or more of the above-described processes, can include compressors, cryopumps, chillers, and the like to cool a substrate. Such methods/apparatus, however, include many moving parts, which can sometimes have rotational and/or vibrational issues, are relatively large, have relatively long or extended cooling periods, and do not provide adequate or precise temperature control.

SUMMARY

Methods and apparatus for processing a substrate are provided herein. In some embodiments, apparatus can include a system for processing a substrate, comprising a process chamber comprising a first processing volume and a second processing volume, a carrier disposed in the first processing volume, comprising a first thermoelectric module (TEM), and configured to support the substrate while the substrate is being heated or cooled, a chuck disposed within the second processing volume, comprising a second TEM, and configured to receive the substrate from the carrier and to support the substrate while the substrate is being heated or cooled, and a system controller configured to monitor a temperature of at least one of the substrate, the carrier, or the chuck during operation, and based on the temperature of the at least one of the substrate, the carrier, or the chuck, supply current to at least one of the first TEM or the second TEM.

In accordance with at least some embodiments of the present disclosure, a method for processing a substrate includes positioning a substrate on at least one of a carrier disposed in a first processing volume, the carrier comprising a first thermoelectric module (TEM), or a chuck disposed within a second processing volume, the chuck comprising a second TEM and monitoring a temperature of at least one of the substrate, the carrier, or the chuck during operation, and based on the temperature of the at least one of the substrate, the carrier, or the chuck, supplying current to at least one of the first TEM or the second TEM.

In accordance with at least some embodiments of the present disclosure, a nontransitory computer readable storage medium having stored thereon instructions that when executed by a processor configure the processor to perform a method for processing a substrate that includes positioning a substrate on at least one of a carrier disposed in a first processing volume, the carrier comprising a first thermoelectric module (TEM), or a chuck disposed within a second processing volume, the chuck comprising a second TEM and monitoring a temperature of at least one of the substrate, the carrier, or the chuck during operation, and based on the temperature of the at least one of the substrate, the carrier, or the chuck, supplying current to at least one of the first TEM or the second TEM.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
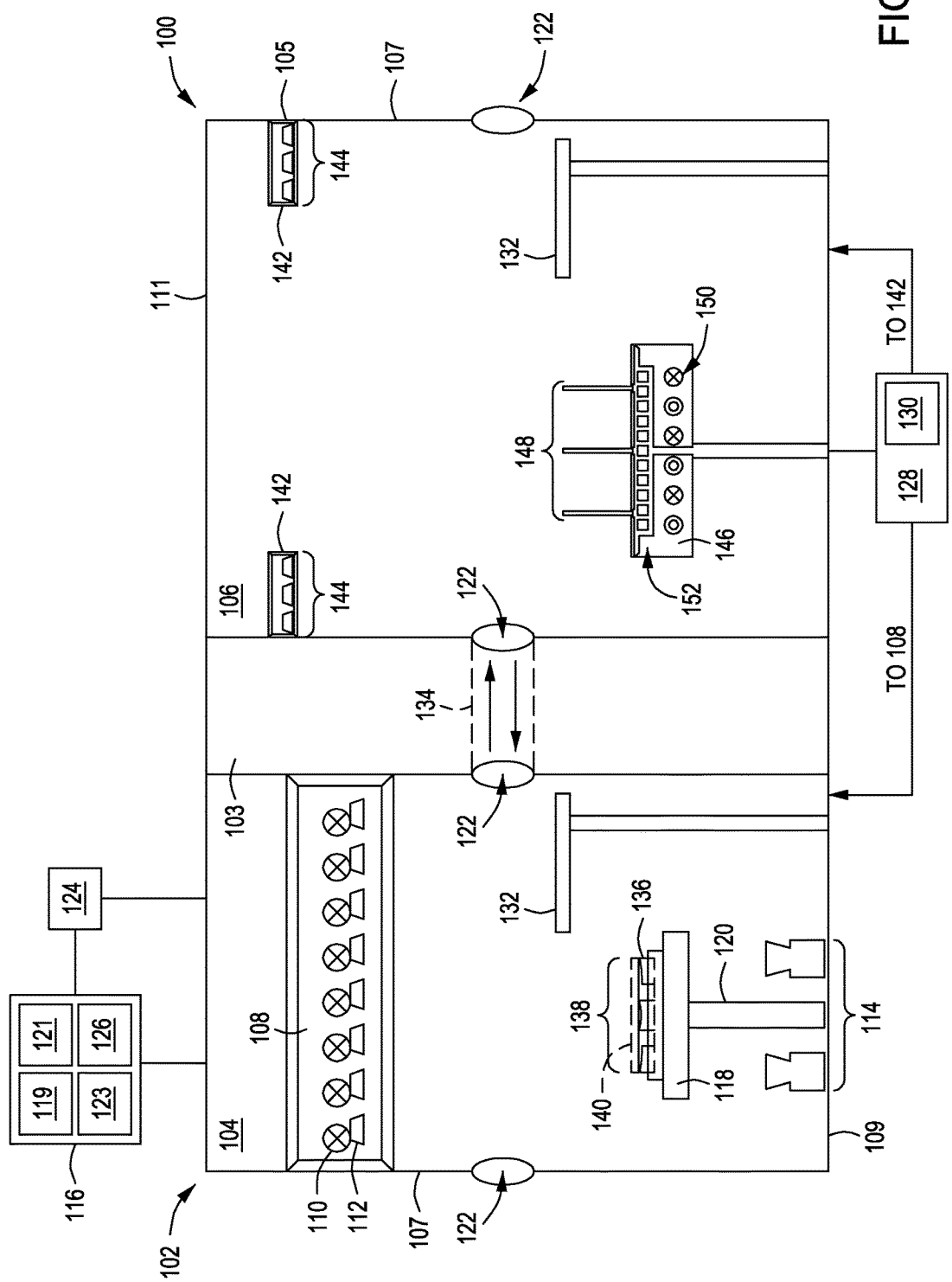
FIG. 1 is a schematic diagram of an apparatus for processing a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure provides methods and apparatus for controlling substrate temperature as the substrate is being processed. For example, apparatus can be embodied in a process chamber including a processing volume configured to receive one or more substrates on a support surface of a substrate support configured to support the substrate while the substrate is being processed. The substrate support includes one or more TEMs that are configured to control a temperature of the substrate by transferring heat to/from the substrate. The methods and apparatus described herein do not use moving parts, which reduces, if not eliminates, rotational or vibrational issues, typically, associated with conventional methods and apparatus—such as those that use a compressors, cryopumps, chillers and the like—are compact in size, provide relatively short cooling periods, and provide precise temperature control of the substrate.

The methods and apparatus described herein can be implemented with one or more processing chambers used in substrate manufacturing. For example, the processing chambers can be used in one or more of FEOL and BEOL processes, such as curing, molding, (e.g., for both FOWLP and InFO), warpage correction, etc. In at some embodiments, the methods and apparatus described herein can be used with a warpage correction apparatus. For example, apparatus can be embodied in a system comprising a process chamber including two processing volumes configured for contactless warpage correction of one or more substrates. More particularly, a first processing volume can be configured to receive one or more substrates (e.g., substrates in need of warpage correction) on a carrier configured to support a substrate while the substrate is being heated (or cooled). The carrier can include one or more TEMs that can be used to facilitate heating of a substrate. During heating of the substrate, the carrier allows for thermal expansion of the substrate, thus allowing the substrate to fully expand to correct warpage of the substrate. After the thermal expansion of the substrate, the substrate can be transferred to a chuck disposed in the second processing volume. The chuck includes one or more TEMs that are configured to rapidly cool the substrate. Rapidly cooling the substrate facilitates maintaining the substrate in a thermally expanded state (e.g., unwarped or substantially flattened state). Accordingly, the system described herein provides a quick, inexpensive, and contactless method for warpage correction of a substrate.

FIG. 1 is a schematic diagram of a system 100 used for processing a substrate in accordance with at least some embodiments of the present disclosure. The system 100 can be embodied in one or more apparatus. For example, in the illustrated embodiment, the system 100 is shown comprising a process chamber 102 that includes a chamber body 105 defined by sidewalls 107, a bottom surface 109, and a top surface 111. The chamber body 105 encloses two processing volumes, a first processing volume 104 and a second processing volume 106 (e.g., made from one or more metals, such as aluminum, steel, etc.) in which one or more, types of substrates can be received for processing. In at least some embodiments, when a substrate is being processed within the first processing volume 104 and the second processing volume 106, the chamber body 105 can be configured to provide a vacuum environment, e.g., to eliminate/reduce thermal cooling dynamics while the substrate is being heated, cooled, transferred between the first processing volume 104 and the second processing volume 106, etc. In at least some embodiments, the system 100 can include two individual stand-alone processing chambers each including respective processing volumes. Alternatively, the system 100 can include two or more process chambers that are part of a common tool or platform, such as a cluster tool.

In some embodiments, the process chamber 102 can be configured for various substrate packaging applications, e.g., 2.5D substrate backend packaging. In such embodiments, the first processing volume 104 of the process chamber 102 can include a first heating device 108 that is configured to heat a substrate to a first temperature. The first heating device 108 can include, for example, one or more of heaters, gas delivery devices, etc. For example, in at least some embodiments, the first heating device 108 can include one or more of a heater 110 and a gas delivery device 112. In at least some embodiments, the heater 110 can be a lamp, coil, or the like and can be configured to provide radiative heating, resistive heating, etc. For example, in at least some embodiments, the heater 110 can be an infrared heating lamp. The heater 110 can be used to facilitate heating a substrate (and/or one or more process gases) to the first temperature Additionally, the gas delivery device 112 can be any gas delivery device suitable for providing one or more heated process gases into the first processing volume, including, but not limited to, a gas delivery shower head, gas delivery ring, and the like. For example, in at least some embodiments, the gas delivery device 112 can be a gas delivery showerhead configured to provide one or more heated gases, e.g., nitrogen, argon, helium, neon, krypton, radon, or other inert gas, etc. into the first processing volume 104 for heating a substrate to the first temperature. For example, in at least some embodiments, the gas delivery device 112 can be configured to provide hot nitrogen gas into the first processing volume 104 for heating the substrate to the first temperature, as will be described in greater detail below.

The first processing volume 104 can include one or more temperature sensors 114 (temperature sensors 114) that are configured to monitor a temperature of the substrate and/or a carrier configured to support the substrate while the substrate is being heated to the first temperature. The temperature sensors 114 can include, but are not limited to, thermopile sensors, non-contact sensor, such as, infrared sensors, and the like. For example, in at least some embodiments, the temperature sensors 114 can include one or more infrared temperature sensors (two infrared sensors shown in FIG. 1). The temperature sensors 114 are operatively coupled to a system controller 113 of the process chamber 102 for monitoring a temperature of the substrate (and/or the carrier), while the substrate is being heated, e.g., in-situ. The temperature sensors 114 can be positioned in different locations within the first processing volume 104, e.g., the sidewalls 107, on the first heating device 108 or adjacent thereto, on the bottom surface 109, etc. In at least some embodiments, such as the illustrated embodiment, the temperature sensors 114 are located on the bottom surface 109 adjacent a carrier in the first processing volume.

The first processing volume 104 can include a carrier 118 that is configured to support a substrate while the substrate (e.g. silicon, germanium, glass, etc.) is being heated to the first temperature. The carrier 118 can be made from a suitable process-compatible material capable of supporting the substrate and being heated to one or more temperatures, e.g., a glass transition temperature ($T_g$). Examples of such suitable materials include, but are not limited to, metal or other type of material having relatively good heat transfer characteristics. For example, the carrier 118 can be made from metal including, but not limited to, steel, aluminum, copper, etc. For example, in at least some embodiments, the carrier 118 can be made rom aluminum.

Additionally, the carrier 118 can have one or more geometric configuration, e.g., circular, rectangular, oval, etc. For example, in at least some embodiments, the carrier 118 can have a generally circular configuration. The inventors have found that the circular configuration provides suitable thermal surface area contact for a substrate, which, in turn, can reduce heat loss from a bottom side or surface of a substrate. The carrier 118 includes a substrate support surface that is configured to support a substrate and configured to allow the substrate to fully expand (e.g., about 10 microns) while the substrate is being heated to the first temperature.

A lift assembly 120 (e.g., including one or more of a motor, an actuator, indexer, or the like) is disposed within the first processing volume 104 and is configured to control a vertical position of the carrier 118. The vertical position of the carrier 118 is, controlled to facilitate transfer of the substrate through openings 122 (e.g., a slit valve opening) disposed along various locations of the process chamber. e.g., for loading/unloading a substrate into/out of the process chamber 102, transferring the substrate between the first processing volume 104 and the second processing volume 106, etc. For example, the openings 122 can be formed through both of the sidewalls 107 and an inner wall 103, which separates the first processing volume 104 and the second processing volume 106, at a height proximate the carrier 118. In some embodiments, the opening 122 may be retractably sealable, for example, to control the pressure and temperature conditions of the first processing volume 104 and the second processing volume 106.

The system controller 116 is provided and coupled to various components of the process chamber 102 to control the operation of the process chamber 102 for processing a substrate. The system controller 116 includes a central processing unit (CPU) 119, support circuits 121 and a memory or non-transitory computer readable storage medium 123. The system controller 116 is operably coupled to and controls the one or more energy sources 124 directly or via computers (or controllers) associated with a particular process chamber and/or support system component. Additionally, the system controller 116 is configured to receive an input from, for example, the temperature sensor for controlling the one or more energy sources 124 such that a temperature of the substrate does not exceed a threshold while the substrate is being processed.

The system controller 116 may be any form of general-purpose computer processor that can be used in an industrial setting for controlling various chambers and sub-processors. The memory, or non-transitory computer readable storage medium, 122 of the system controller 116 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 121 are coupled to the CPU 119 for supporting the CPU 119 in a conventional manner. The support circuits 121 include cache, power supplies, clock circuits, input/output circuitry and subsystems, and the like. Inventive methods as described herein, such as the method for processing a substrate (e.g., noncontact warpage correction), may be stored in the memory 122 as software routine 126 that may be executed or invoked to control the operation of the one or more energy sources 124 in the manner described herein. The software routine may also be stored and/or executed by a second CPU (not shown) that is remotely located from the hardware being controlled by the CPU 119.

The one or more energy sources 124 can supply power to the process chamber 102 and the components thereof using either or both of DC power and RF power. The one or more energy sources 124 can be used to power, for example, the system controller 116, the first heating device 108 including the heater 110 and the gas delivery device 112, the lift assembly 120, the temperature sensors 114, one or more robots of the process chamber 102, one or more TEMs disposed on the carrier 118 or a chuck disposed in the second processing volume 106, as will be described in greater detail below.

A gas supply 128 is coupled to the process chamber 102 and is configured to provide one or more heated process gases suitable for heating a substrate via, for example, the gas delivery device 112, into the first processing volume 104 and the second processing volume 106. As noted above, the process gas can be, for example, nitrogen, argon, helium, neon, krypton, radon, or other inert gas, etc. The gas supply 128 is configured to supply heated process gas into the first processing volume 104 and the second processing volume 106 to heat a substrate to a first temperature. In at least some embodiments, the gas supply 128 can include a heating device (not shown) that can heat a process gas to a sufficient temperature. Alternatively or additionally, the heater 110 can be configured to heat the process gas prior to the process gas being injected into the first processing volume 104 via the gas delivery device 112. For example, in at least some embodiments, the gas supply 128 can provide heated process gas, e.g., nitrogen, to the gas delivery device 112 of the first heating device 108 to heat a warped substrate (and/or the carrier 118) to a glass transition temperature ($T_g$) of the substrate (and/or an epoxy on a substrate, if provided). Heating the substrate to the glass transition temperature $T_g$ of the substrate and allowing the substrate to freely expand on the carrier 118 flattens or straightens the substrate to an unwarped or substantially flattened configuration. In at least some embodiments, the carrier 118 and a substrate can be heated to thermal equilibrium. As can be appreciated, heating a substrate (and/or the carrier 118) to the glass transition temperature $T_g$ of the substrate (and/or an epoxy on a substrate, if provided) and/or to thermal equilibrium can depend on one more factors including, but not limited to, a type of material that a substrate, epoxy, and/or a carrier is made from, etc. The inventors have found, for example, that the glass transition temperature $T_g$ for most substrates presently used is at a temperature of about 150° C. to about 200° C. However, the actual glass transition temperature $T_g$ of any given substrate will depend upon the composition of the substrate and may be greater or less than the above temperature range.

A vacuum source 130 (or pump) can be coupled to the gas supply 128 and an exhaust port (not shown) in the chamber body 105 of the processing chamber 102 to control a pressure during processing and/or exhaust hot gas from the first processing volume 104 and the second processing volume 106, as will be described in greater detail below. In at least some embodiments, the vacuum source 130 can be configured to provide suction to a chuck disposed in the second processing volume 106, as will be described in greater detail below.

One or more robots are disposed within the first processing volume 104 and/or the second processing volume 106. For example, in at least some embodiments, a robot 132 can be disposed within each of the first processing volume 104 and the second processing volume 106. The robots 132 can be any robot suitable for transferring a substrate into and out of the first processing volume 104 and the second processing volume 106, and for transferring a substrate between the first processing volume 104 and the second processing volume 106. For example, in at least some embodiments, the robots 132 can be configured to receive a substrate, e.g., from a load lock (not shown) coupled to the process chamber 102, and position the substrate onto and off of the carrier 118 and a chuck disposed within the second processing volume 106. The robots 132 are also configured to transfer a substrate from the first processing volume 104 to the second processing volume 106 (and vice versa) via, for example, a pathway 134 (shown in phantom in FIG. 1) defined through the inner wall 103. For example, in at least some embodiments, the robot 132 in the first processing volume 104 can transfer the carrier 118 including a substrate which have been previously processed, e.g., heated to the glass transition temperature $T_g$ of the substrate (and/or an epoxy on a substrate, if provided) and/or thermal equilibrium between a substrate and carrier, through the pathway 134 and handoff the carrier 118 including the substrate to the robot 132 of the second processing volume 106. The robot 132 of the second processing volume 106 can, subsequently, transfer the substrate to a chuck disposed within the second processing volume 106, as will be described in greater detail below.

A substrate 136 can be made from one or more materials, including, but not limited to, silicon, germanium, glass, etc. For example, in at least some embodiments, the substrate 136 can be made from silicon, e.g., a through-silicon via (TSV) interposer substrate assembly. Additionally, one or more solder bumps (not explicitly shown) can be disposed on the substrate 136 and configured to support one or more corresponding IC chips 138. An epoxy mold 140 can be used to fully or partially encapsulate the substrate 136. For example, in at least some embodiments, the epoxy mold 140 can be used to encapsulate only the one or more solder bumps on the substrate 136. e.g., epoxy mold underfill. Additionally, in at least some embodiments, the epoxy mold 140 can be used to encapsulate both the one or more solder bumps and the ICs chips 138, as illustrated in FIG. 1.

Continuing with reference to FIG. 1, the second processing volume 106 can be substantially identical to the first processing volume 104. For example, the second processing volume 106 can include one or more heating devices. More particularly, the second processing volume 106 can include a second heating device 142 that is configured to maintain the substrate 136 at the first temperature during transfer of the substrate 136 from the first processing volume 104 to the second processing volume 106. For example, in at least some embodiments, the second heating device 142 can include a gas delivery device 144. The gas delivery device 144 can be any gas delivery device including, but not limited to, a gas delivery shower head, gas delivery ring, and the like. For example, in at least some embodiments, the gas delivery device 144 can be a gas delivery ring that is disposed above a chuck 146. For example, in at least some embodiments, the gas delivery device 144 can be disposed above the chuck 146 and can extend radially outward from the chuck 146. The gas delivery device 144 is configured to provide one or more hot gases, e.g., nitrogen, to maintain the substrate 136 at the first temperature, e.g., to the glass transition temperature $T_g$ of the substrate (and/or an epoxy on a substrate, if provided) and/or to thermal equilibrium between a substrate and carrier, prior to cooling the substrate 136, as will be described in greater detail below. Alternatively or additionally, as described above with respect to the first heating device 108, in at least some embodiments, the second heating device 142 can further include a heater (e.g., a lamp, coil, or the like) configured to provide radiative heating, resistive heating, etc. For example, in at least some embodiments, the heater can be an infrared heating lamp configured to heat a substrate and/or a process gas.

The chuck 146 can include one or more pins (or supports) 148 that are configured to allow the carrier 118 including the substrate 136 to be positioned above the chuck 146 when the chuck 146 is in the first position. The pins 148 correspond to a plurality of exposed slots of the carrier 118. For illustrative purposes, three pins 148 are shown in FIG. 1. Additionally, in at least some embodiments, rows of pins can be provided. For example, instead of having only one pin corresponding to an exposed region of a carrier, two or more pins in a row of pins can correspond to each exposed slot, e.g., for additional support or stability.

Additionally, the chuck 146 is movable from a first position for receiving the substrate 136 from the carrier 118 to a second position for cooling the substrate 136. More particularly, when the substrate 136 is being transferred from the carrier 118 to the chuck 146, the chuck 146 is in the first position. In the first position, the chuck 146 is in a lowered configuration and the pins 148 are exposed (e.g., uncovered from the chuck 146, see FIG. 1, for example). The robot 132 under the control of the system controller 116 positions the carrier 118 so that the exposed slots of the carrier 118 align with the pins 148. Once aligned, the robot 132 moves the carrier 118 above the chuck 146 so that the carrier 118 can be lowered and the substrate 136 positioned on the pins 148. With the substrate 136 positioned on the pins 148, and the carrier 118 no longer positioned above the chuck 146, the chuck 146 can be moved to the second position. In the second position the chuck 146 is in a raised configuration and the pins 148 are no longer exposed (e.g., covered by the chuck 146) and the substrate 136 is supported by a top surface of the chuck 146.

A plurality of internal cooling channels 150 can be provided on the chuck 146 and are configured to provide one or more suitable cooling fluids to rapidly cool the substrate 136 when the substrate 136 is positioned on the chuck 146, e.g., with the chuck in the raised configuration. The cooling fluid can be, for example, chilled water or other suitable heat transfer fluid (e.g., dielectric fluid, such as, GALDEN®, or the like). For example, in at least some embodiments, the cooling fluid used to rapidly cool the substrate 136 can be chilled water.

Additionally, a plurality of conduits or channels 152 or other suitable device cable of providing suction from the vacuum source 130 are defined within the chuck 146 and are configured to provide suction to a top surface of the chuck 146 during operation, as will be described in greater detail below.

Figure 2:
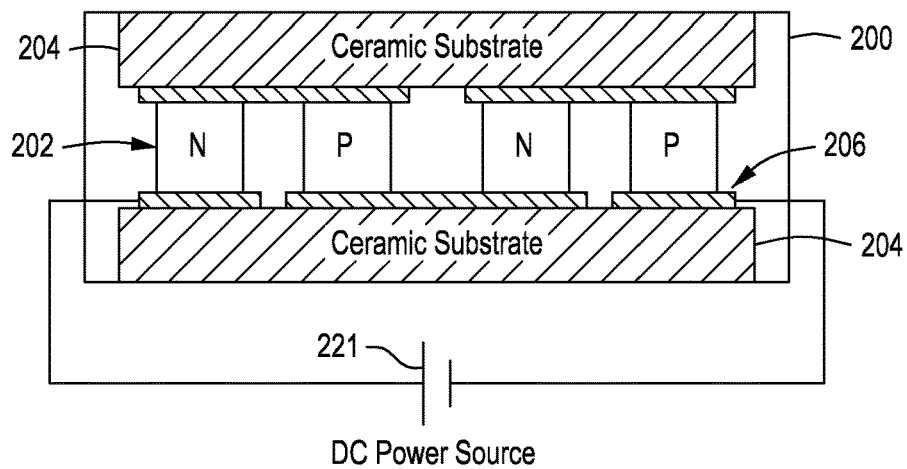
FIG. 2 is schematic side view diagram of a thermoelectric module (TEM) in accordance with at least some embodiments of the present disclosure.

FIG. 2 is diagram of a TEM 200 in accordance with at least some embodiments of the present disclosure. The TEM 200 can be disposed on the carrier 118 and/or the chuck 146. The TEM 200 includes of an array of p and n doped semiconductor elements. For illustrative purposes, two p and n doped semiconductor elements (hereinafter collectively referred to as semiconductor elements 202) are shown. In at least some embodiments, the semiconductors elements 202 can be arranged in an array in which the semiconductor elements 202 are electrically connected in series and thermally connected in parallel to each other.

The semiconductor elements 202 can be disposed between two or more dielectric/nonconductive substrates including, but not limited to, glass, ceramic, mica, or and/or other suitable dielectric/nonconductive substrates, such as those made from liquid or gas. For example, in at least some embodiments, the semiconductor elements 202 can be disposed between two ceramic substrates 204. The ceramic substrates 204 can be connected to the semiconductor elements 202 via electrical interconnects 206, such as wires in parallel or series, which can be connected to corresponding ones of the ceramic substrates 204 via one or more suitable connection methods, such as bonding. The electrical interconnects 206 are connected to the one or more power sources for supplying current to the TEMs 200. For illustrative purposes, the electrical interconnects 206 are shown connected to the one or more energy sources 124, which can include a DC power source 221.

Using an array of TEMs allows for very uniform cooling/heating and accurate temperature control across an entire surface of a substrate support, with or without cooling channels. Moreover, depending on a configuration of the TEMs, e.g., whether in series or parallel, various zonal temperature control schemes can be used. For example, by reversing a polarity of a current through the TEMS, the TEMS can be used to heat a substrate rather than cool a substrate, thus resulting in an extremely versatile apparatus which can be tuned based on a user's requirements. For example, in at least some embodiments, a substrate support (e.g., the carrier 118 and/or the chuck 146) that includes the TEMs 200 enables zonal heating and/or cooling within the same substrate support, as described in greater detail below. For example, heating the substrate 136 can be performed while a substrate is disposed on the carrier 118 and cooling the substrate 136 can be performed while a substrate is disposed on the chuck 146, or vice versa.

Figure 3:
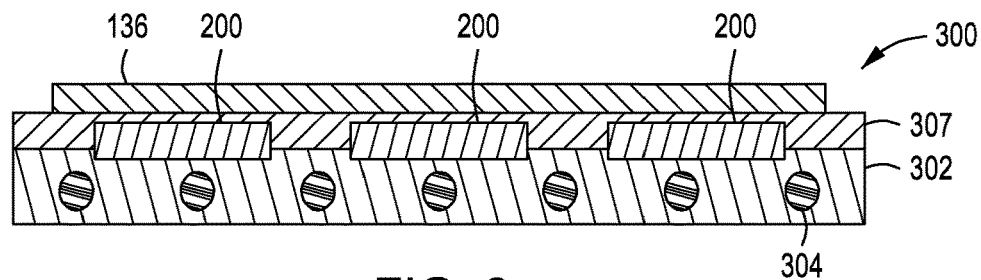
FIG. 3 is a schematic side view diagram of pedestal including the TEM of FIG. 2 in accordance with at least some embodiments of the present disclosure.

FIG. 3 is a diagram of a substrate support 300, which can be used for the carrier 118 and the chuck 146, including the TEM 200 of FIG. 2 in accordance with at least some embodiments of the present disclosure. As a result of the compactness of the TEMs 200, an array of the TEMs 200 can be integrated into the substrate support 300 (e.g., within a base 302 of the substrate support 300) with or without other cooling capabilities, e.g., heat sink or other suitable cooling capabilities. For example, in at least some embodiments, such as when the substrate support 300 includes fluid channels 304 for supplying one or more coolants, e.g., process chilled water (PCW) or other suitable coolant, the TEMs 200 can be disposed in relatively close proximity to the fluid channels 304. For example, in at least some embodiments, the TEMs 200 can be disposed in a top layer 307, a top surface of which can support a substrate, of the substrate support 300 above the fluid channels 304. Alternatively or additionally, the TEMs 200 can be disposed in the top layer 307 of the substrate support 300 below the fluid channels 304. Unlike conventional methods and apparatus that use compressors, chillers, and/or cryopumps to cool a substrate (e.g., the substrate 136) the methods and apparatus described herein can use an array of TEMs in conjunction with, for example, PCW to achieve sub-zero temperatures for cooling a substrate in a relatively quick manner.

Figure 4:
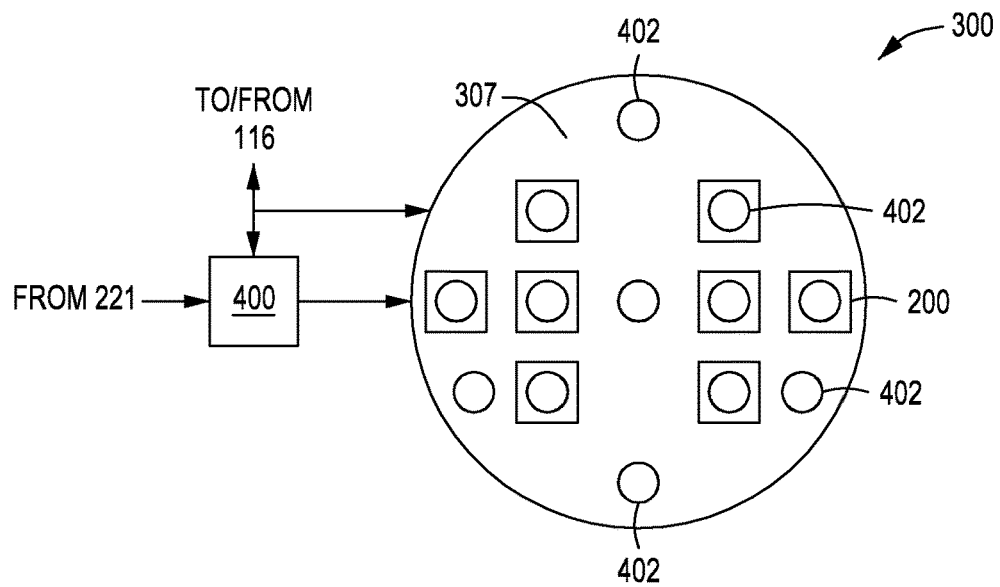
FIG. 4 is a schematic top view of a substrate support surface of a pedestal including a plurality of TEMs arranged in an array on the substrate support surface in accordance with at least some embodiments of the present disclosure.

FIG. 4 is a top view of a substrate support surface of the substrate support 300 including a plurality of TEMs arranged in an array on the top layer 307 in accordance with at least some embodiments of the present disclosure. As illustrated in FIG. 4, a plurality of TEMs 200 can be arranged in array in the top layer 307 to ensure adequate transfer of heat to/from a substrate. For example, in at least some embodiments an array of the TEMs 200 can include TEMs disposed adjacent a periphery of the top layer 307 and TEMs disposed, adjacent a center of the top layer 307. Other arrangements/configurations of TEMs can also be used.

As noted above, various zonal heating and/or cooling schemes can be used to achieve one or more desirable effects. For example, in at least some embodiments, the system controller 116 can be configured to control each of the TEMs 200 so that the TEMs disposed adjacent the periphery of the top layer 307 (e.g., a first portion) can be used to heat the substrate 136 and the TEMs disposed adjacent the center of the top layer 307 (e.g., a second portion) can be used to cool the substrate 136, or vice versa. Alternatively or additionally, the system controller 116 can be configured to independently control each of the TEMs 200 so that other temperature control arrangements and/or configurations of TEMs 200 can also be used. To achieve the various control arrangements, additional electrical interconnections, switches, power sources, etc. can be provided. For example, in at least some embodiments, a switch 400 can be connected to the DC power source 221 and the system controller 116 and can be configured to independently provide current to each of the TEMs 200 to achieve one or more various temperature control arrangements.

Disposed in the top layer 307 can be one or more sensors. For example, in at least some embodiments, one or more thermocouples 402 can be disposed in/on the top layer 307 and can be in communication with the system controller 116. During processing, the thermocouples 402 can be configured for measuring temperature of the top layer 307, the substrate 136 and/or each of the TEMs 200 and providing a measured temperature to the system controller 116. In at least some embodiments, for example, one or more of the thermocouples 402 can be configured to provide temperature measurements of the top layer 307 and/or the substrate 136 and one or more of the thermocouples 402 can be configured to provide temperature measurements of a corresponding one of the TEMs 200.

Figure 5:
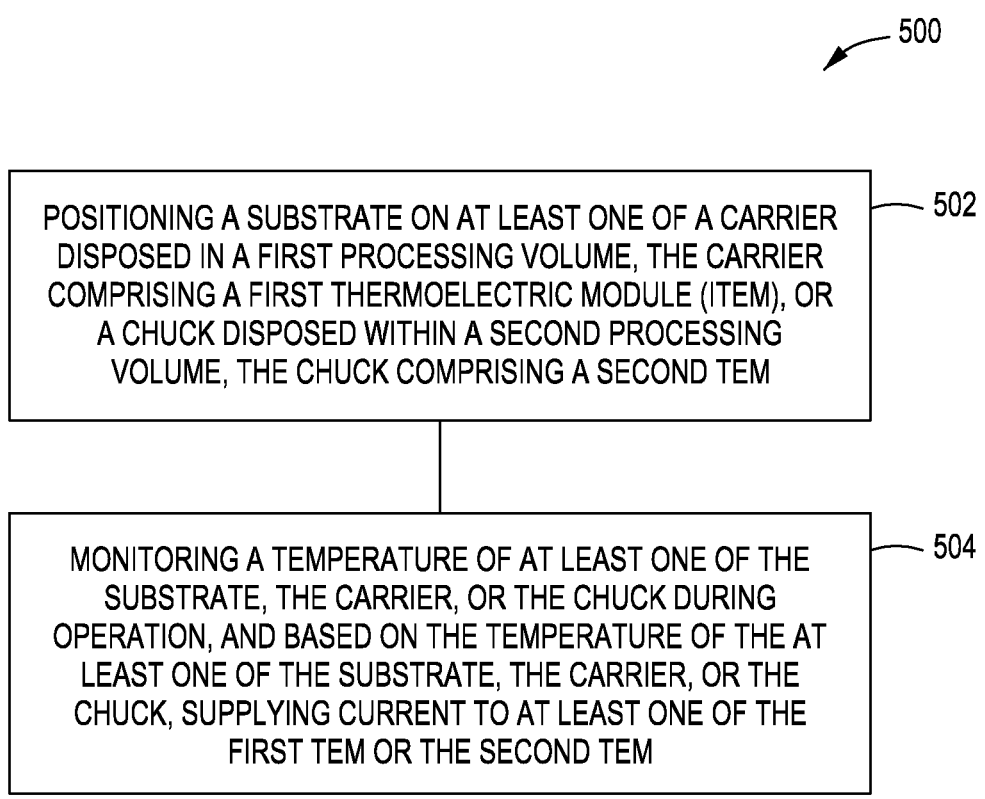
FIG. 5 is a flowchart of a method for processing a substrate in accordance with at least some embodiments of the present disclosure.

FIG. 5 is a flowchart of a method 500 for processing a substrate in accordance with at least some embodiments of the present disclosure. The method 500 generally begins at 502, where a substrate is positioned on a substrate support (e.g., at least one of a carrier disposed in a first processing volume or a chuck disposed within a second processing volume). For example, at 502 a warped substrate can be disposed on the carrier 118 to heat the warped substrate (and/or the carrier 118) to a glass transition temperature ($T_g$) so that the substrate is no longer warped. Similarly, at 502 a substrate that has been treated in the first processing volume, can be transferred to the chuck 146 of the second processing volume so that the heated, unwarped substrate can be rapidly cooled to maintain the substrate in the unwarped state.

At 504, a temperature of the substrate support (e.g., the carrier 118 or the chuck 146) disposed in a processing volume of a processing chamber and/or a substrate (e.g., the substrate 136) supported thereon is monitored during operation. For example, during processing of the substrate, one or more thermocouples (e.g., thermocouples 402) can be used to monitor the substrate support (or a substrate support surface) and/or the substrate. For example, in at least some embodiments, such as when the substrate 136 is disposed on the carrier 118 or the chuck 146, the one or more thermocouples 402 can be used to monitor a temperature of the carrier 118 or the chuck 146 as the substrate 136 is being heated or cooled, respectively, or vice versa.

Moreover, based on a temperature of the substrate support and/or substrate, at 504 current can be supplied to one or more TEMs (e.g., TEMs 200) disposed on the substrate support to cool or heat the substrate. For example, in at least some embodiments, the thermocouples can be configured for monitoring/measuring a temperature of the substrate support and/or substrate and for providing temperature measurements of the substrate support and/or substrate to a system controller (e.g., the system controller 116). In response to receiving the temperature measurements, the system controller can supply current to the TEMs. For example, depending on the configuration (e.g., polarity) of the TEMs, the current through TEMs can either be used for cooling the substrate or heating the substrate. For example, when the substrate 136 is disposed on the carrier 118, current through TEMs can be used for heating the substrate 136. Similarly, when the substrate 136 is disposed on the chuck 146, current through TEMs can be used for cooling the substrate 136. By varying the amount of current supplied to the TEMs, the cooling/heating effect can be increased or decreased (e.g., the temperature can be controlled).

While the foregoing is directed to embodiments of the present disclosure, other and further embodiments of the disclosure may be devised without departing from the basic scope thereof.

The invention claimed is:

1. A system for processing a substrate, comprising:
a process chamber comprising a first processing volume and a second processing volume;
a carrier disposed in the first processing volume, comprising an array of a plurality of first thermoelectric modules (TEMs), and configured to support the substrate while the substrate is being heated or cooled;
a chuck disposed within the second processing volume, comprising an array of a plurality of second TEMs, and configured to receive the substrate from the carrier and to support the substrate while the substrate is being heated or cooled; and
a controller configured to monitor a temperature of at least one of the substrate, the carrier, or the chuck during operation, and based on the temperature of the at least one of the substrate, the carrier, or the chuck, supply current to some of the plurality of first TEMs for cooling a first portion of the substrate and supplying current to some of the plurality of first TEMs for heating a second portion of the substrate different from the first portion of the substrate or supply current to some of the plurality of second TEMs for cooling the first portion of the substrate and supplying current to some of the plurality of second TEMs for heating the second portion of the substrate different from the first portion of the substrate.

2. The system of claim 1, wherein each of the plurality of first TEMs and plurality of second TEMs comprises a plurality of p and n doped semiconductor elements.

3. The system of claim 2, wherein the plurality of p and n doped semiconductor elements are arranged in an array in which the p and n doped semiconductor elements are electrically connected in series to each other and thermally connected in parallel to each other.

4. The system of claim 2, wherein each of the plurality of first TEMs and the plurality of second TEMs comprises two ceramic substrates between which the plurality of p and n doped semiconductor elements are disposed and connected to electrical interconnects connected to the two ceramic substrates.

5. The system of claim 4, wherein each of the plurality of first TEMs and the plurality of second TEMs is connected to a power source via the electrical interconnects.

6. The system of claim 1, wherein each of the carrier and the chuck comprises a plurality of channels configured to receive a coolant for cooling the substrate.

7. A method for processing a substrate, comprising:
positioning a substrate on at least one of a carrier disposed in a first processing volume, the carrier comprising an array of a plurality of first thermoelectric modules (TEMs), or a chuck disposed within a second processing volume, the chuck comprising an array of a plurality of second TEMs; and
monitoring a temperature of at least one of the substrate, the carrier, or the chuck during operation, and based on the temperature of the at least one of the substrate, the carrier, or the chuck,
supplying current to some of the plurality of first TEMs for cooling a first portion of the substrate and supplying current to some of the plurality of first TEMs for heating a second portion of the substrate different from the first portion of the substrate; or
supplying current to some of the plurality of second TEMs for cooling the first portion of the substrate and supplying current to some of the plurality of second TEMs for heating the second portion of the substrate different from the first portion of the substrate.

8. The method of claim 7, wherein each of the plurality of first TEMs and plurality of second TEMs comprises a plurality of p and n doped semiconductor elements.

9. The method of claim 8, wherein the plurality of p and n doped semiconductor elements are arranged in an array in which the p and n doped semiconductor elements are electrically connected in series to each other and thermally connected in parallel to each other.

10. The method of claim 8, wherein each of the plurality of first TEMs and the plurality of second TEMs comprises two ceramic substrates between which the plurality of p and n doped semiconductor elements are disposed and connected to electrical interconnects connected to the two ceramic substrates.

11. The method of claim 10, wherein each of the plurality of first TEMs and the plurality of second TEMs is connected to a power source via the electrical interconnects.

12. The method of claim 7, further comprising providing a coolant to a plurality of channels on at least one of the carrier or the chuck.

13. A non-transitory computer readable storage medium having stored thereon instructions that when executed by a processor perform a method for processing a substrate, comprising:
positioning a substrate on at least one of a carrier disposed in a first processing volume, the carrier comprising an array of a plurality of first thermoelectric modules (TEMs), or a chuck disposed within a second processing volume, the chuck comprising an array of a plurality of second TEMs; and
monitoring a temperature of at least one of the substrate, the carrier, or the chuck during operation, and based on the temperature of the at least one of the substrate, the carrier, or the chuck,
supplying current to some of the plurality of first TEMs for cooling a first portion of the substrate and supplying current to some of the plurality of first TEMs for heating a second portion of the substrate different from the first portion of the substrate; or
supplying current to some of the plurality of second TEMs for cooling the first portion of the substrate and supplying current to some of the plurality of second TEMs for heating the second portion of the substrate different from the first portion of the substrate.

14. The non-transitory computer readable storage medium of claim 13, wherein each of the plurality of first TEMs and plurality of second TEMs comprises a plurality of p and n doped semiconductor elements.

15. The non-transitory computer readable storage medium of claim 14, wherein the plurality of p and n doped semiconductor elements are arranged in an array in which the p and n doped semiconductor elements are electrically connected in series to each other and thermally connected in parallel to each other.

16. The non-transitory computer readable storage medium of claim 14, wherein each of the plurality of first TEMs and the plurality of second TEMs comprises two ceramic substrates between which the plurality of p and n doped semiconductor elements are disposed and connected to electrical interconnects connected to the two ceramic substrates.

17. The non-transitory computer readable storage medium of claim 16, wherein each of the plurality of first TEMs and the plurality of second TEMs is connected to a power source via the electrical interconnects.

* * * * *